(12) United States Patent
Takado

(10) Patent No.: US 6,844,633 B2
(45) Date of Patent: Jan. 18, 2005

(54) SEALING RESIN, RESIN-SEALED SEMICONDUCTOR AND SYSTEM-IN-PACKAGE

(75) Inventor: Tsumoru Takado, Kumamoto (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/210,770

(22) Filed: Aug. 1, 2002

(65) Prior Publication Data

US 2003/0025214 A1 Feb. 6, 2003

(30) Foreign Application Priority Data

Aug. 2, 2001 (JP) ........................................ 2001-234324

(51) Int. Cl.$^7$ .............................................. H01L 23/29
(52) U.S. Cl. ...................................... 257/795; 257/788
(58) Field of Search ................................ 257/787, 788, 257/789, 791–795

(56) References Cited

U.S. PATENT DOCUMENTS 5,498,657 A * 3/1996 Sugiyama et al. .......... 524/463
6,165,398 A * 12/2000 Matsumoto et al. .......... 264/87
RE37,022 E * 1/2001 Sugiyama et al. .......... 524/463
6,300,244 B1 * 10/2001 Itabashi et al. ............. 438/678

FOREIGN PATENT DOCUMENTS

| CN | 1282105 | 1/2001 |
|---|---|---|
| JP | 56-010947 | 2/1981 |
| JP | 57-212225 | 12/1982 |
| JP | 62-261161 | 11/1987 |
| JP | 02-226615 | 9/1990 |

* cited by examiner

Primary Examiner—David A. Zarneke
(74) Attorney, Agent, or Firm—Katten Muchin Zavis Rosenman

(57) ABSTRACT

Sealing resin comprising a resin component and filler mixed in the resin component, the filler having grain size distribution with a plurality of grain size peaks. The complex internal structure can be filled with the sealing resin including the filler particles with the plurality of the filler distribution peaks.

9 Claims, 3 Drawing Sheets

GRAIN DISTRIBUTION OF SILICA FILLER

SEALING RESIN, RESIN-SEALED SEMICONDUCTOR AND SYSTEM-IN-PACKAGE

BACKGROUND OF THE INVENTION (a) Field of the Invention

The present invention relates to sealing resin including filler for resin sealing having a plurality of filler distribution peaks, and each peak of the filler fills a plurality of corresponding gaps, and further relates to a resin-sealed semiconductor and a resin-sealed system-in-package.

(b) Description of the Related Art

Sealing resin used for the package of a semiconductor device includes epoxy resin as a basic component and silica filler. The sealing resin has been described in a variety of the patent publications.

For example, JP-A-56(1981)-10947 and JP-A-57(1982)-212225 describe the mixture of crystalline silica powder and molten silica powder, and JP-A-62(1987)-261161 describes the use of the mixture of crushed silica and spherical silica as the filler. Although JP-A-2(1990)-226615 describes the specific surface areas and the shapes of the mixture of crushed silica and fine molten spherical filler, the grain distribution of the filler such as grain size or shape distribution is not recognized for filling the spacing in the object having a complex structure. Especially, arrangement of the different filler distributions corresponding to different gaps or spaces are not disclosed.

The object to be sealed by the resin molding represented by the system-in-package has the tendency toward the complexity of the structure. Currently, the difference between the intervals of the gaps during the resin filling generates problems of non-filling and voids. However, at the present stage, the filler grain distribution is not known exerting excellent influent on the filling of the different gaps.

SUMMARY OF THE INVENTION

In view of the foregoing, an object of the present invention is to provide sealing resin having excellent filler distribution on the different spaces or gaps for sealing by resin molding.

The present invention provides sealing resin including a resin component and filler mixed in the resin component, the filler having grain size distribution with a plurality of grain size peaks.

In accordance with the present invention, the complex internal structure can be filled with the sealing resin including the filler particles with the plurality of the filler distribution peaks, or with a plurality of different filler distributions. When the internal structure includes a narrower gap with which the resin is hardly filled and a wider gap with which the resin is easily filled, the narrower gap is filled with the sealing resin with the filler having the smaller particle size and the wider gap is filled with the sealing resin with the filler having the larger particle size, thereby achieving the smooth filling of the internal structure with the sealing resin.

The above and other objects, features and advantages of the present invention will be more apparent from the following description.

PREFERRED EMBODIMENTS OF THE INVENTION

Figure 1:
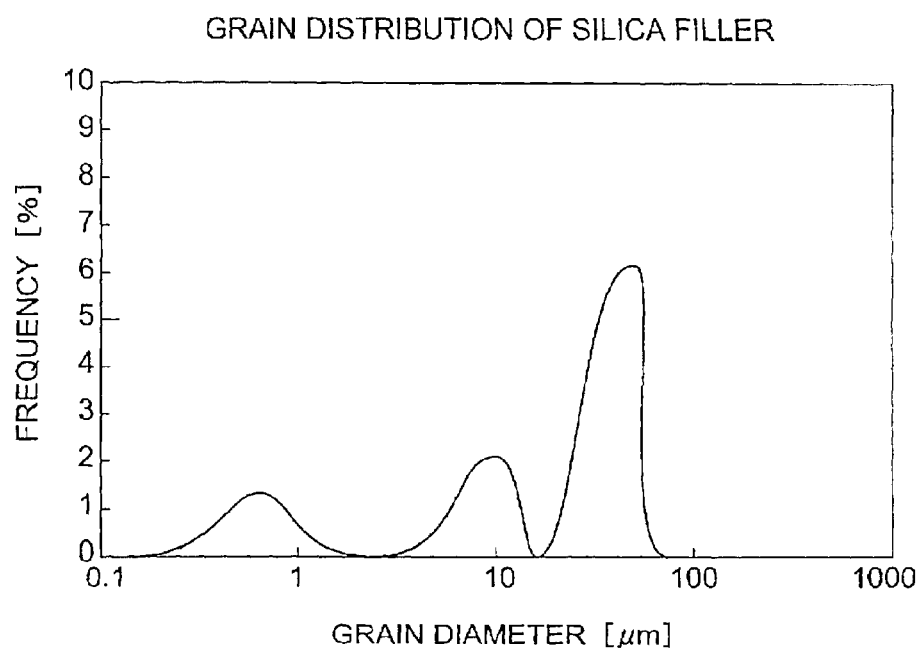
FIG. 1 is a graph showing an example of the filler distribution having three distribution peaks.

Now, the present invention is more specifically described.

The filler used in the resin includes a plurality of different grain size distributions or a plurality of grain size peaks, and the different grain size distributions may be generated preferably by using crushed filler and spherical filler. The preferable material of the filler is silicas.

The increase of the amount of the spherical filler elevates the fluidity, and the increase of the amount of the crushed filler prevents the package crack due to the reflow during the mounting. In the present invention, the appropriate grain distribution is selected depending on the inner distance of the space filled with the resin, thereby improving the degree of the filling. The selection of the smaller spherical filler enables the efficient filling of the narrow gap having the essentially lower degree of filling, and the selection of the larger crushed filler enables the efficient filling of the wider gap.

Non-filling due to the sheltering can be prevented by making the maximum particle of each of the fillers within 70 to 85% of each of the widths of the gaps.

The "crushed filler" is generally prepared by crushing the raw material, and the "spherical filler" is generally prepared by melting the particles finely pulverized in a flame fusion furnace to make the shape spherical. In connection with their appearances, the crushed filler is the particle having the shape with sharp angles as crushed particle usually has, and the spherical filler is a real spherical particle or a rounded particle without acute angles. The shapes of the fillers can be confirmed by using an electron microscope or a metallurgical microscope.

In the region having a narrower gap where a thin film must be molded, the filler grain size of the conventional filler particles having a particle size larger than the narrower gap among those from the lowest to the highest particle sizes blocks the narrower gap, thereby preventing the filling. However, in the present invention, the filler size is adjusted such that the smaller size particle is used for preventing the filler particle from blocking the narrower gap through which the resin flows. In other words, the filler receives the smaller resistance when the resin enters into the tap then flows into other regions. The resistance value can be easily derived by using the Bernoulli equation. The ratio of the filler effected by a boundary layer with respect to the total distribution amount is relatively small. The larger size filler in the distribution flows along the flow line.

The change of the filler distribution generally changes the viscosity. The viscosity change may be suppressed by controlling the entire specific surface area and the other composition such as a curing agent.

When the sealing resin having two independent filler distributions or two distribution peaks is used for sealing the structure having the narrower gap and the wider region as a main stream and, in addition, the structure such as internal bonding wires which may be a main factor of preventing the flow, the bonding wires may be deformed by the viscosity increase due to the mal-distribution of the filler and the influence of the larger filler.

In such an internal structure, a third filler distribution in which the filler easily flows between the bonding wires (the filler having the maximum gain distribution peak which is within 70 to 85% of the distance between the adjacent wires) is added to provide the three filler distributions, thereby controlling the flow along the wire. However in this instance, the particle size of the filler must be equal to or more than 200% of the width of the narrower gap. An example of the filler distribution having three distribution peaks is shown in a graph of FIG. 1.

Now, Embodiments of the present invention is more specifically described with reference to accompanying drawings.

Figure 2:
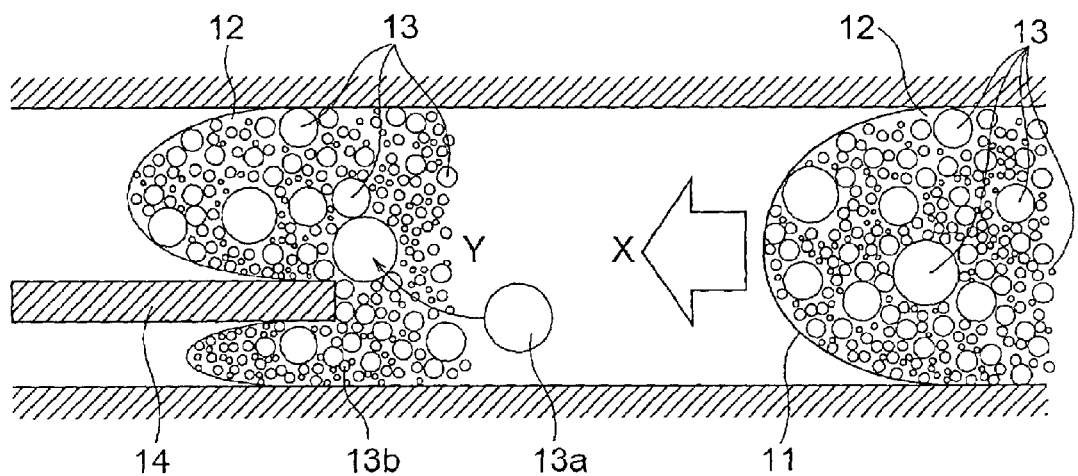
FIG. 2 is a cross sectional view showing Embodiment 1 of the present invention.

As shown in FIG. 2, sealing resin 11 of Embodiment 1 including melted resin 12 and a plurality of filler particles 13 dispersed therein flows in a space of, for example, a semiconductor package in a direction shown by an arrow "X".

The sealing resin 11 comes into collision with bonding wires 14 after the advance of a specified distance. Then, the smaller filler particles 13b fill the narrower space divided by the bonding wire 14, and the larger filler 13a fills the broader space. Even when the larger filler particle 13a exists in the narrower space, the particle 13a moves toward the broader space as specified by an arrow "Y". In this manner, the filling of the broader space and the narrower space can be completed without insufficient filling by using the sealing resin having the plurality of independent filler distributions.

Figure 3A:
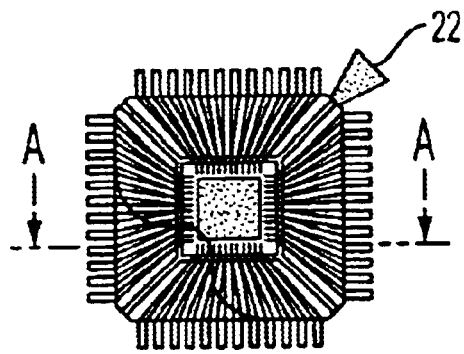
FIG. 3A is a top plan view showing Embodiment 2 of the present invention.
Figure 3B:
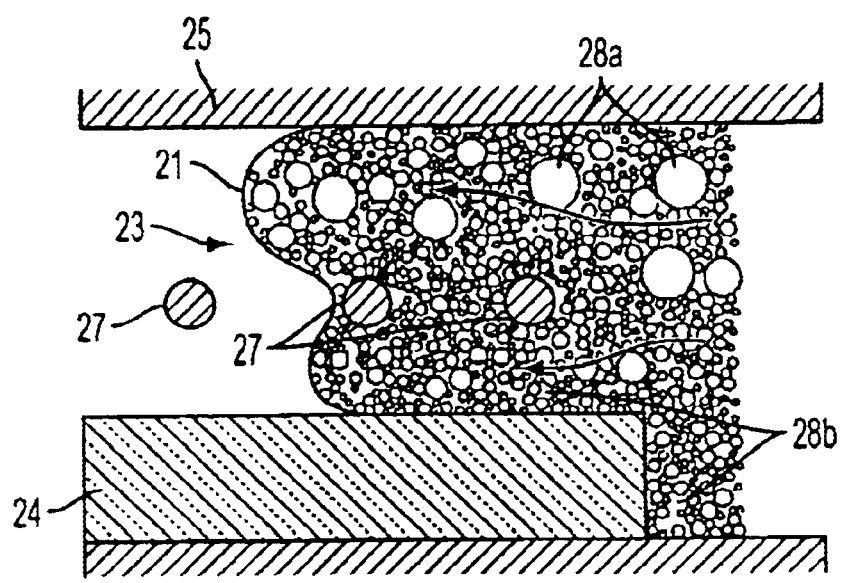
FIG. 3B is a cross sectional view taken along the line A—A of FIG. 3A.

As shown in FIGS. 3A and 3B, sealing resin 21 of Embodiment 2 is introduced through an inlet 22 to be filled in a space 23 surrounded by a semiconductor device 24 and package walls 25 in a semiconductor package. Bonding wires 27 are omnipresent in the space 23. Smaller filler particles 28b fill the smaller space such as those between the bonding wires 27 and between the bonding wire 27 and the semiconductor device 24, and larger filler particles 28a fill the larger space such as that between the package walls 25 and the bonding wire 27.

Figure 4:
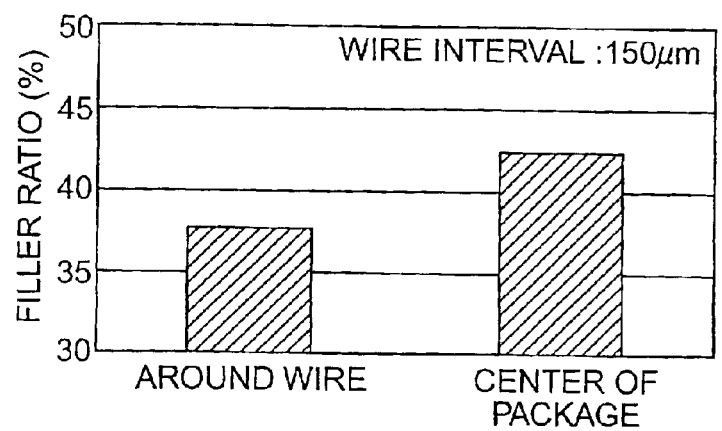
FIG. 4 is a graph showing the ratios of the filler around the wires and at the center of the package.

In Embodiment 2 shown in FIG. 3B, the ratios of the cross sectional area of the filler with respect to the total cross sectional area of the filler and the cross sectional area of the resin component were measured in a quad flat package (QFP) when the wire interval was 150 μm. As shown in a graph of FIG. 4, the ratio of the filler around the wires was about 38%, and that at the center of the package was about 43%. The results show that the larger space includes the larger amount of the filler than the smaller space.

EXAMPLES

Examples of the sealing resin of the present invention will be described. However, these Examples do not restrict the present invention.

Example 1

Sealing resin of Example 1 includes melted resin and crushed and/or spherical filler particles dispersed therein. The spherical filler particles have a maximum grain distribution peak at approximately 1.8 μm inclusive and an "n" value of an inclination angle in a Rosin-Rammler diagram between 0.8 and 1.4 inclusive, and the crushed or spherical filler particles have a maximum grain distribution peak at approximately 20 μm inclusive, and an "n" value of an inclination angle in a Rosin-Rammler diagram between 0.6 and 1.4 inclusive. The sealing resin of Example 1 exhibits the excellent filling characteristics for a semiconductor package.

The maximum grain distribution peak may vary depending on conditions such as inner distance of the space to be filled by about ±10%.

The "n" value of the inclination angle in the Rosin-Rammler diagram represented by a dotted line is an index of frequency of the filler particles or the integral density of the filler particles.

Example 2

Sealing resin of Example 2 includes melted resin and a plurality of filler particles dispersed therein.

First spherical filler particles have the maximum grain distribution peak at approximately 0.75 μm inclusive and an "n" value of an inclination angle in a Rosin-Rammler diagram between 0.8 and 1.4 inclusive. Second spherical filler particles have the maximum grain distribution peak at approximately 2.0 μm inclusive and an "n" value of an inclination angle in a Rosin-Rammler diagram between 0.8 and 1.4 inclusive. Third spherical or crushed filler particles have the maximum grain distribution peak at approximately 20 μm inclusive and an "n" value of an inclination angle in a Rosin-Rammler diagram between 0.6 and 1.4 inclusive.

The sealing resin of Example 2 has three independent filler distributions, thereby controlling the filling more precisely. The filler having the largest particle peak corresponds to the crushed filler to enable the flow control of the rapid flow of the sealing resin.

Figure 5:
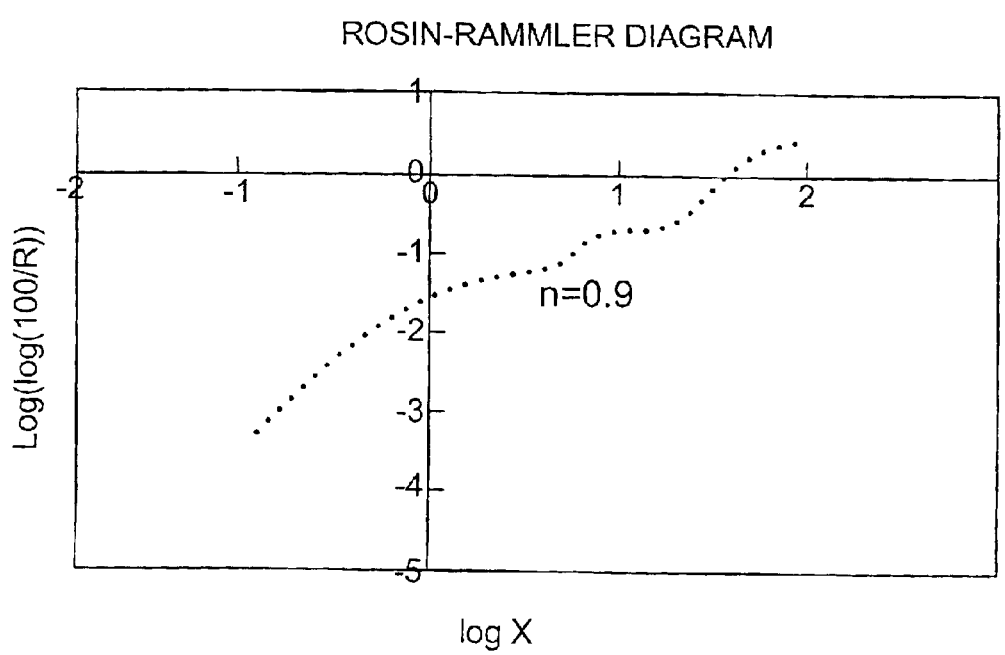
FIG. 5 is a graph showing the Rosin-Rammler diagram of the filler distribution of FIG. 1.

The Rosin-Rammler diagram of the filler distribution of FIG. 1 is shown in a graph of FIG. 5, wherein the inclination angle "n" is about 0.9.

Since the above embodiments are described only for examples, the present invention is not limited to the above embodiments and various modifications or alternations can be easily made therefrom by those skilled in the art without departing from the scope of the present invention.

What is claimed is:

1. Sealing resin for resin-سealing a semiconductor, comprising a resin component and a filler mixed in the resin component, the filler having grain size distribution with a plurality of grain size distribution peaks, wherein the filler included a crushed filler and a spherical filler each having grain size distribution peaks of said plurality of grain size distribution peaks, each of said plurality of grain size distribution peaks corresponding to a grain size which is within 70 to 85% of a gap width corresponding to a minimum cross-sectional area to be sealed.

2. A sealing resin for resin-sealing a semiconductor, comprising a resin component and a filler mixed in the resin component, the filler having grain size distribution with a plurality of grain size distribution peaks and including a crushed filler having a grain size distribution peak and a spherical filler having a grain size distribution peak differing from the grain size distribution peak of the crushed filler, wherein the spherical filler has a grain size distribution peak at 1.8 μm with ±10% variations and a "n" value of an inclination angle in a Rosin-Rammler diagram between 0.8 and 1.4 inclusive, and the crushed filler has a grain distribution peak at 10 μm and an "n" value of an inclination angle in a Rosin-Rammler diagram between 0.6 and 1.4 inclusive.

3. A sealing resin for resin-sealing a semiconductor, comprising a resin component and a filler mixed in the resin component, the filler having grain size distribution with a plurality of grain size distribution peaks and including a crushed filler having a grain size distribution peak and a spherical filler having a grain size distribution peak differing from the grain size distribution peak of the crushed filler, wherein said spherical filler includes a first spherical filler which has a grain size distribution peak at 0.75 μm and an "n" value of an inclination angle in a Rosin-Rammler diagram between 0.8 and 1.4 inclusive, a second spherical filler within has a grain size distribution peak at 2.0 μm and an "n" value of an inclination angle in the Rosin-Rammler diagram between 0.8 and 1.4 inclusive, and further comprising a third filler selected from a spherical filler or a crushed filler which has a grain size distribution peak at 20 μm inclusive and an "n" value of an inclination angle in the Rosin-Rammler diagram between 0.6 and 1.4 inclusive.

4. The sealing resin as defined in claim 1, wherein an "n" value of an inclination angle in a Rosin-Rammler diagram corresponding to each of said plurality of grain size distribution peaks of the filler is between 0.6 and 1.4 inclusive.

5. The sealing resin as defined in claim 1, wherein a degree of filling of filler particles in a resin composition is between 70 and 90% in weight inclusive.

6. A resin-sealed semiconductor comprising a resin-sealed semiconductor package filled with the sealing resin as defined in claim 1.

7. A system-in-package comprising a semiconductor device and a functional part thereof filled with the sealing resin as defined in claim 1.

8. A resin-sealed semiconductor comprising a resin-sealed semiconductor package filled with a sealing resin as defined in claim 2.

9. A system-in-package comprising a semiconductor device and a functional part thereof filled with the sealing resin as defined in claim 3.

* * * * *